(12) United States Patent
Kitamura et al.

(10) Patent No.: US 7,391,039 B2
(45) Date of Patent: Jun. 24, 2008

(54) SEMICONDUCTOR PROCESSING METHOD AND SYSTEM

(75) Inventors: Yuichi Kitamura, Kyoto (JP); Naoto Sugiura, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 181 days.

(21) Appl. No.: 11/371,935

(22) Filed: Mar. 10, 2006

(65) Prior Publication Data

US 2006/0255270 A1 Nov. 16, 2006

(30) Foreign Application Priority Data

May 12, 2005 (JP) ............................. 2005-139725

(51) Int. Cl.
*G01N 23/00* (2006.01)
*G21K 7/00* (2006.01)
*A61N 5/00* (2006.01)
*H01J 37/08* (2006.01)

(52) U.S. Cl. .................. 250/492.3; 250/306; 250/307; 250/309; 250/310; 250/491.1; 250/492.1; 250/492.2; 250/492.21

(58) Field of Classification Search ............ 250/492.21, 250/492.3
See application file for complete search history.

(56) References Cited

U.S. PATENT DOCUMENTS

| | | | | |
|---|---|---|---|---|
| 4,576,884 A | * | 3/1986 | Reisman ..................... | 430/30 |
| 4,841,143 A | * | 6/1989 | Tamura et al. ............... | 250/288 |
| 4,933,565 A | * | 6/1990 | Yamaguchi et al. ......... | 250/492.2 |
| 5,012,109 A | * | 4/1991 | Shichi et al. ................ | 250/491.1 |
| 5,113,072 A | * | 5/1992 | Yamaguchi et al. ......... | 250/309 |
| 5,229,607 A | | 7/1993 | Matsui et al. | |
| 5,525,806 A | | 6/1996 | Iwasaki et al. | |
| 5,578,823 A | * | 11/1996 | Taniguchi ................... | 250/311 |
| 5,594,245 A | * | 1/1997 | Todokoro et al. ........... | 250/310 |
| 5,656,811 A | * | 8/1997 | Itoh et al. ................... | 250/309 |

(Continued)

FOREIGN PATENT DOCUMENTS

JP 5-290786 11/1993

(Continued)

OTHER PUBLICATIONS

Antoniou, N., et al. "End point of silicon milling using an optical beam induced current signal for controlled access to integrated circuits for backside circuit editing" J. Vac. Sci. Technol. Nov./Dec. 2002, 20(6), pp. 2695-2699.

(Continued)

*Primary Examiner*—David A. Vanore
*Assistant Examiner*—Bernard Souw
(74) *Attorney, Agent, or Firm*—McDermott Will & Emery LLP

(57) ABSTRACT

A secondary electron image generated by an electron beam is detected by a secondary electron/secondary ion detector while a silicon substrate is etched by a focused ion beam from a back surface of a semiconductor chip. A time point where the electron beam transmits through the silicon substrate, a contrast of a secondary electron image of a separation layer, a polysilicon layer and the like is detected by a picture image processing system is assumed to be a processing end point. At this time, by changing a setting for an acceleration voltage of the electron beam, an arbitrary remaining silicon thickness can be obtained.

6 Claims, 7 Drawing Sheets

U.S. PATENT DOCUMENTS

| | | | |
|---|---|---|---|
| 5,969,357 A * | 10/1999 | Todokoro et al. | 250/310 |
| 6,114,695 A * | 9/2000 | Todokoro et al. | 250/310 |
| 6,303,932 B1 * | 10/2001 | Hamamura et al. | 250/309 |
| 6,548,810 B2 * | 4/2003 | Zaluzec | 250/306 |
| 7,138,629 B2 * | 11/2006 | Noji et al. | 250/311 |
| 2002/0197750 A1 * | 12/2002 | Tanaka et al. | 438/14 |
| 2004/0262518 A1 * | 12/2004 | Lu et al. | 250/307 |
| 2005/0276932 A1 * | 12/2005 | Takaoka et al. | 427/585 |
| 2006/0043292 A1 * | 3/2006 | Matsui | 250/310 |
| 2006/0060781 A1 * | 3/2006 | Watanabe et al. | 250/310 |
| 2006/0097166 A1 * | 5/2006 | Ishitani et al. | 250/310 |
| 2006/0255270 A1 * | 11/2006 | Kitamura et al. | 250/310 |

FOREIGN PATENT DOCUMENTS

| | | |
|---|---|---|
| JP | 2001-050919 | 2/2001 |
| JP | 2002-298774 | 10/2002 |

OTHER PUBLICATIONS

Japanese Office Action, with English translation, issued in Japanese Patent Application No. JP 2005-139725, mailed Oct. 2, 2007.

Antoniou, N., et al. "End point of silicon milling using an optical beam induced current signal for controlled access to integrated circuits for backside circuit editing" J. Vac. Sci. Technol. Nov./Dec. 2002, 20(6), pp. 2695-2699.

* cited by examiner

SEMICONDUCTOR PROCESSING METHOD AND SYSTEM

BACKGROUND OF THE INVENTION

1. Field of the Invention

The present invention relates to semiconductor processing method and system for processing a semiconductor chip with high accuracy.

2. Description of the Related Art

Conventionally, in processing and analyzing a semiconductor chip, a processing to a semiconductor chip has been performed from a surface thereof using a focused ion beam (FIB). In recent years, however, as a design rule for a semiconductor process becomes finer and finer and a semiconductor chip includes more and more layers stacked therein, it becomes more difficult to analyze a semiconductor chip from a surface thereof. In such circumstances, techniques for performing processing and analysis of a semiconductor chip from a back surface have become important. To analyze a semiconductor chip from a back surface thereof, a silicon substrate has to be processed so as to have a very small thickness. In general, in order to process a silicon substrate so as to have a small thickness, as shown in FIG. 9, it is necessary to form a trench such that a remaining thickness of silicon is precisely controlled to be uniform. In FIG. 9, the reference numeral 1 denotes a silicon substrate located in the back surface side of a semiconductor device and the reference numeral 4 denotes an interlevel insulation film located in the surface side of the semiconductor device. The interlevel insulation film 4 includes a polysilicon layer, a metal interconnect layer and the like together constituting a semiconductor integrated circuit or the like. The reference numeral 6 denotes a focused ion beam generator used for forming a trench in a silicon substrate. The reference numeral 6a denotes a focused ion beam.

When a trench (large area excavation in silicon) is formed by performing a focused ion beam processing from a back surface of a semiconductor chip, OBIC (optical beam induced current) generated when a PN junction is exposed to light is used in detection of an end point of a trench processing. Specifically, in this method, a laser is irradiated to part of a semiconductor chip which is to be processed, increase in OBIC caused as a silicon film thickness is reduced is monitored, and a maximum point in a graph showing observed variation points is determined to be a processing end point. This processing method will be described with reference to FIG. 10. In FIG. 10, the reference numerals 1 through 5 show a structure of a semiconductor chip. Specifically, the reference numeral 1 denotes a silicon substrate of which a surface is a back surface of a semiconductor chip. The reference numeral 2 denotes a polysilicon layer. The reference numeral 3 denotes a metal interconnect layer. The reference numeral 4 denotes an interlevel insulation film. The reference numeral 5 denotes a separation layer. Moreover, the reference numeral 6 is a focused ion beam generator. The reference numeral 6a is a focused ion beam. The reference numeral 7 denotes a laser light irradiator for irradiating laser light used for observing the progress of formation of a trench. The reference numeral 7a is laser light. In the structure of FIG. 10, the focused ion beam 6a is scanned while part of the semiconductor chip to be processed is exposed to the laser light 7a using the laser light irradiator 7, thereby performing a trench processing. As the trench processing proceeds in such a manner, a silicon remaining thickness becomes smaller and smaller and, accordingly, light irradiated to a PN junction at a silicon interface is increased. The reference numeral 22 denotes a measurement instrument for measuring OBIC varying according to the amount of irradiated light. This variation in OBIC is shown in a graph of FIG. 11. FIG. 11 is a graph showing variation in OBIC relative intensity obtained by the measuring equipment 22 with processing time. In FIG. 11, an OBIC relative intensity is increased as the trench processing proceeds. By monitoring the variation in the OBIC relative intensity and detecting a maximum point of the OBIC, a processing end point is determined. Details of the trench processing technique employing OBIC observation are described in the following non-patent reference 1.

(Non-patent reference 1) J. Vac. Sci. Technol. B20 (6), November/December 2002

(Patent reference 1) Japanese Laid-Open Publication No. 2001-50919

SUMMARY OF THE INVENTION

However, OBIC is generated from an entire junction in a trench processing range and reflects only an averaged remaining thickness at a trench. Accordingly, if processing variations due to the focused ion beam 6a are caused, a uniform remaining thickness can not be maintained. For example, as shown in FIG. 10, there might be cases where a bottom surface of the trench is not a flat surface. Even worse, there might be cases where a film does not remain locally. Detection of a maximum point of OBIC is very difficult and this makes detection of an end point difficult. Therefore, it is difficult to perform a processing such that a remaining thickness becomes an arbitrary thickness. If a PN junction does not exist at a silicon interface, OBIC is not generated, and it is not possible to perform a processing to part of a chip in which a PN junction does not exist at a silicon interface. In addition, to detect OBIC, a power supply line for a regular monitor has to be pulled out from a semiconductor chip. Because of this, the number of process steps is increased.

It is an object of the present invention to allow formation of a trench with a very uniform remaining thickness in silicon, even when a PN junction does not exist in a silicon interface, by performing a precisely controlled trench processing.

To achieve the above-described object, the present invention focuses on a transmission property of an electron beam with which a clear image of an internal structure of a semiconductor chip in a very small range, even where a PN junction does not exist, can be obtained. Using a transmission property of an electron beam, a secondary electron image for a predetermined target located little further from (at a deeper position than) a processing end point is observed. A distance between the predetermined target and the processing end point is determined using variation in an intensity of contrast of the secondary electron image. Then, based on a result of the determination, feedback is performed to a focused ion beam processing.

Specifically, the present invention provides a semiconductor processing method for processing a surface of a semiconductor substrate by scanning of a focused ion beam. The method includes: a focused ion beam irradiation step of irradiating the focused ion beam to process the surface of the semiconductor substrate; an electron beam irradiation step of irradiating an electron beam having a predetermined transmission property to part of the surface of the semiconductor substrate which is processed by the focused ion beam; an observation step of detecting a first secondary electron image generated by irradiation of the electron beam and a secondary ion image and a second secondary electron image which are generated by irradiation of the focused ion beam and observing the images; and a processing control step of determining, based on a contrast intensity of the first secondary electron image, the secondary ion image or the second secondary electron image which has been detected in the observation step and which shows an image of a predetermined target located inside the semiconductor substrate, a distance from the part of the semiconductor substrate surface which is processed by the focused ion beam to the predetermined target and controlling a processing progress by controlling an output of the focused ion beam according to a result of the determination.

Also, the present invention provides a semiconductor processing system for irradiating a focused ion beam to perform processing to a surface of a semiconductor substrate. The system includes: a focused ion beam irradiator for irradiating the focused ion beam to the surface of the semiconductor substrate; an electron beam irradiator for irradiating an electron beam having a predetermined transmission property to part of the surface of the semiconductor substrate which is processed by the focused ion beam; an observation section for detecting a first secondary electron image generated by irradiation of the electron beam and a secondary ion image and a second secondary electron image which are generated by irradiation of the focused ion beam and observing the images; and a processing control section for determining, based on a contrast intensity of the first secondary electron image, the secondary ion image or the second secondary electron image which has been detected in the observation step and which shows an image of a predetermined target located inside the semiconductor substrate, a distance from the part of the semiconductor substrate surface which is processed by the focused ion beam to the predetermined target and transmitting a control signal for controlling a processing progress by the focused ion beam according to a result of the determination According to the present invention, when a semiconductor substrate is processed by a focused ion beam, an electron beam is irradiated to part of a semiconductor substrate that is processed by the focused ion beam to observe a secondary electron image located a little deeper than the processed part. A secondary ion image and a secondary electron image which are obtained by irradiation of the focused ion beam are also observed. Then, from variation in intensity of contrast of the second secondary electron image or the secondary ion image it is judged that part of the semiconductor substrate processed is becoming closer to a predetermined target in the semiconductor substrate. Based on a result of the judgment, scanning of the focused ion beam is controlled. Thus, information for progress of the processing is fed back to the processing by the focused ion beam, so that processing accuracy is increased.

Specifically, according to the present invention, a state of part of the semiconductor substrate located a little deeper than part thereof processed by the focused ion beam can be understood from variation in intensity of contrast of the second electron image or the second ion image, so that feedback to a processing by the focused ion beam can be performed. Accordingly, even if the focused ion beam has variations, the semiconductor substrate can be processed with high accuracy. Moreover, because the electron beam is used, the obtained secondary electron image has a high resolution and a clear internal structure image can be obtained even for part of the semiconductor chip in which a PN junction does not provided. Therefore, in a trench processing from a back surface of a silicon chip, a processing can be performed with high accuracy (in terms of remaining thickness controllability and uniformity) in a simple manner.

It is preferable that in the inventive semiconductor processing method, a series of process steps including the focused ion beam irradiation step, the electron beam irradiation step and the observation step is repeated, and in the processing control step, when the contrast intensity has reached the predetermined level by repetition of the series of process steps, an output of the focused ion beam is stopped.

Thus, in an exfoliation analysis of a surface of a silicon chip, a processing can be stopped right before the processing reaches anomaly part in the silicon chip and the anomaly part can be observed.

DESCRIPTION OF THE PREFERRED EMBODIMENTS

Hereafter, semiconductor processing system and method according to embodiments of the present invention will be described with reference to the accompanying drawings.

First Embodiment

First, a semiconductor processing according to a first embodiment of the present invention will be described with reference to FIG. 1.

Figure 1:
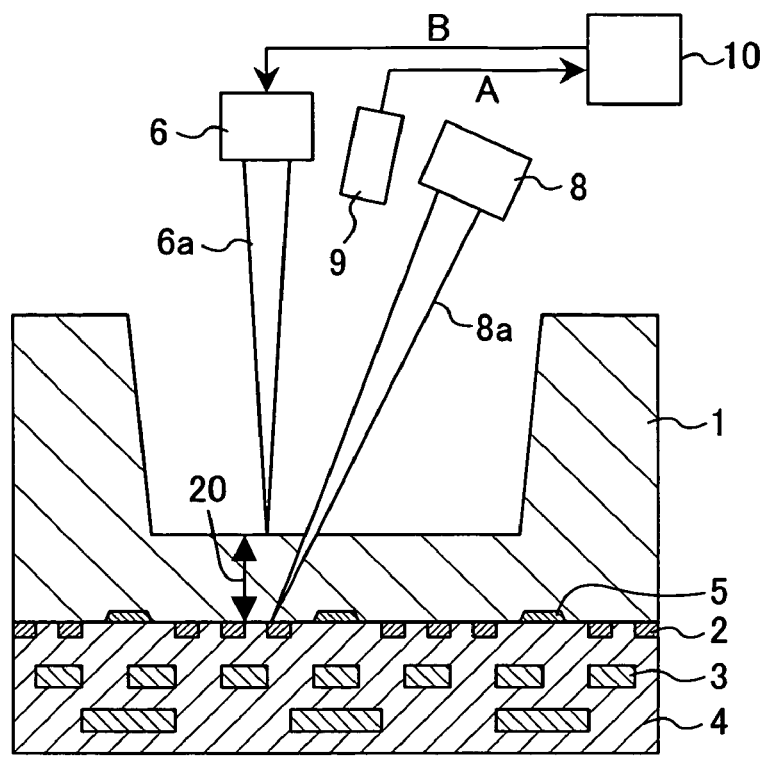
FIG. 1 is a schematic view illustrating semiconductor processing system and method according to a first embodiment of the present invention.

FIG. 1 illustrates a cross section of a silicon chip (semiconductor substrate) and a semiconductor processing system for performing a trench processing to the silicon chip from a back surface thereof. The silicon chip includes a silicon substrate 1, a polysilicon layer 2, a metal interconnect layer 3, an interlevel insulation film 4 and a separation layer 5. The reference numeral 6 denotes a focused ion beam irradiator for irradiating a focused ion beam 6a to a silicon chip and performing a trench processing. The reference numeral 8 denotes an electron beam irradiator for irradiating an electron beam 8a to a silicon chip to observe the inside of the silicon chip.

The reference numeral 9 denotes a secondary electron/secondary ion detector (observation section) for observing a second ion image and a secondary electron image (second secondary electron image) which are generated when the focused ion beam 6a is irradiated to the silicon chip and a secondary electron image (first secondary electron image) generated when the electron beam 8a is irradiated to the silicon chip. The reference numeral 10 denotes a picture image processing system (processing control section) for receiving picture information A obtained from the secondary electron/secondary ion detector 9 and feedback-controlling the focused ion beam irradiator 6 by a feedback signal (control signal) B.

FIG. 1 of this embodiment shows a state where a trench processing is performed to the silicon substrate 1 by scanning of the focused ion beam 6a from the silicon substrate 1 side, which is the back surface side of the silicon chip. The electron beam 8a is irradiated to substantially the same part of the semiconductor chip as the focused ion beam 6a and is used for detecting a processing end point.

A semiconductor processing method configured in the above-described manner will be described.

First, as shown in FIG. 1, as a processing end point, a point (target processing end point) is set at a certain distance from the boundary between the silicon substrate 1 and the interlevel insulation film 4 such that a certain silicon film thickness 20 remains. When the focused ion beam 6a scans, part of the silicon substrate 1 which the focused ion beam 6a scans is etched, so that a trench is formed (focused ion beam irradiation step). In this process, when the focused ion beam 6a is irradiated for a while and trench formation has proceeded to a certain extent, the electron beam 8a is irradiated to almost the same part as the focused ion beam 6a to obtain a secondary electron image (electron beam irradiation step) and then a processed surface is observed (observation step). When observation is completed, scanning of the focused ion beam 6a for a trench processing is started again and then irradiation of the electron beam 8a and observation of a processed surface are performed. In this manner, a series of process steps from processing using the focused ion beam 6a to observation of a secondary ion image and a secondary electron image which result from irradiation of the focused ion beam 6a and a secondary electron image resulting from irradiation of the electron beam 8a is repeated so that the trench processing proceeds.

Figure 2:
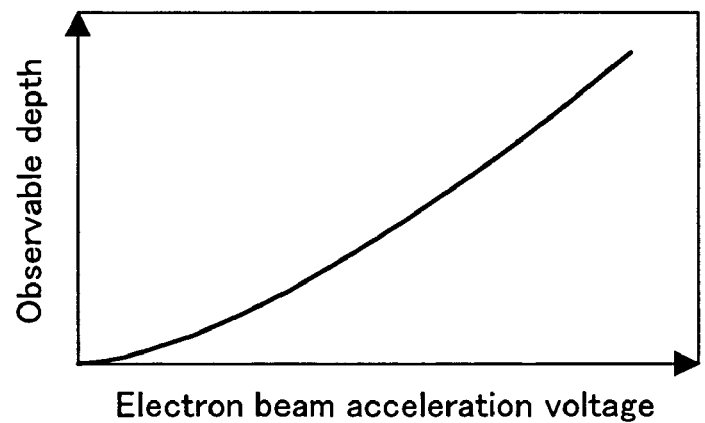
FIG. 2 is a graph for explaining setting of processing end point according to each of first through seventh embodiment of the present invention.

In FIG. 2, the relationship between the electron beam 8a and an acceleration voltage applied to the electron beam 8a. As shown in FIG. 2, as an applied acceleration voltage is increased, a transmission property of the electron beam 8a is increased, so that an observable depth is increased. In this embodiment, the acceleration voltage applied to the electron beam 8a is set such that a mean free path of electrons has a distance substantially the same as the silicon film thickness 20. With this setting, nothing appears in the secondary electron image generated by irradiation of the electron beam 8a in an initial stage of a processing. But as the processing proceeds and the bottom of a trench is reaching the interlevel insulation film 4, images of the separation layer 5, the polysilicon layer 2, the metal interconnect layer 3 and the interlevel insulation film 4 appear due to the transmission property of the electron beam 8a and a contrast in the secondary electron image (first secondary electron image) gradually becomes high. That is, it can be judged by variation in a contrast intensity of the secondary electron image generated by the electron beam 8a how much the processing has preceded and an end point is becoming closer. If a mechanism (processing control section) for performing a processing control in which when a contrast intensity of the secondary electron image reaches a certain level, scanning of the focused ion beam 6a is stopped (the processing is terminated) is provided in the image processing system 10, or the contrast is visually checked and then the processing is terminated, as shown in FIG. 1, a trench processing can be precisely performed so that a silicon remaining thickness becomes uniform.

In this embodiment, a single secondary electron/secondary ion detector 9 for detecting the secondary ion image and the secondary electron image generated by the focused ion beam 6a and the secondary electron image generated by the electron beam 8a is provided. However, two secondary electron/secondary ion detectors 9 for the focused ion beam 6a and the electron beam 8a, respectively, may be separately provided.

Second Embodiment

In this embodiment, system and method for controlling a silicon remaining thickness so that the silicon remaining thickness is set to be an arbitrary set value.

A silicon remaining thickness can be controlled to be an arbitrary set value by controlling a transmission property of an electron beam 8a. The transmission property of the electron beam 8a differs between target materials. In general, as shown in FIG. 2 in the first embodiment, the transmission property of the electron beam 8a becomes larger as an acceleration voltage applied to the electron beam 8a is increased. For example, it has been shown by experiments that the electron beam 8a can pass through 0.48 µm at an acceleration voltage of 10 kV and 2.3 µm at an acceleration of 25 kV. In first embodiment, the acceleration voltage of the electron beam 8a is set so that a mean free path of electrons is the same as the silicon film thickness 20. By changing a set value for the acceleration voltage to be applied to the electron beam 8a, a silicon substrate 1 can be processed so as to have an arbitrary remaining thickness. That is, a remaining thickness of the silicon substrate 1 at a processing end point can be set by controlling the acceleration voltage to be applied to the electron voltage of the electron beam 8a and a sensitivity of an image processing system 10 for stopping scanning of a focused ion beam 6 (terminating a processing).

When it is intended that a silicon substrate is not left (a remaining thickness is 0), the acceleration voltage to be applied to the electron beam 8a may be set to be very low or scanning of the focused ion beam 6a may be stopped (processing is terminated) by using a secondary electron image (second secondary electron image) or a secondary ion image generated by scanning of the focused ion beam 6a (the electron beam 8a is not used). The transmission property of the focused ion beam 6a is very small, compared to the transmission property of the electron beam 8a, and it becomes possible not to leave the silicon substrate. This technique to leave no silicon substrate is used when an exfoliation analysis is performed from a silicon back surface and when a separation layer is exposed in a cross section analysis.

Third Embodiment

In each of the first and second embodiments, a method for performing a processing so that the silicon substrate 1 has an arbitrary remaining film thickness has been described. However, in an actual semiconductor chip, before being processed, the silicon substrate 1 does not always have a certain thickness everywhere and a surface thereof is not always flat. In this embodiment, semiconductor processing system and method which allow precise processing of a silicon substrate 1 in controllability and uniformity of a remaining film thickness even in the above-described case will be described.

Figure 4:
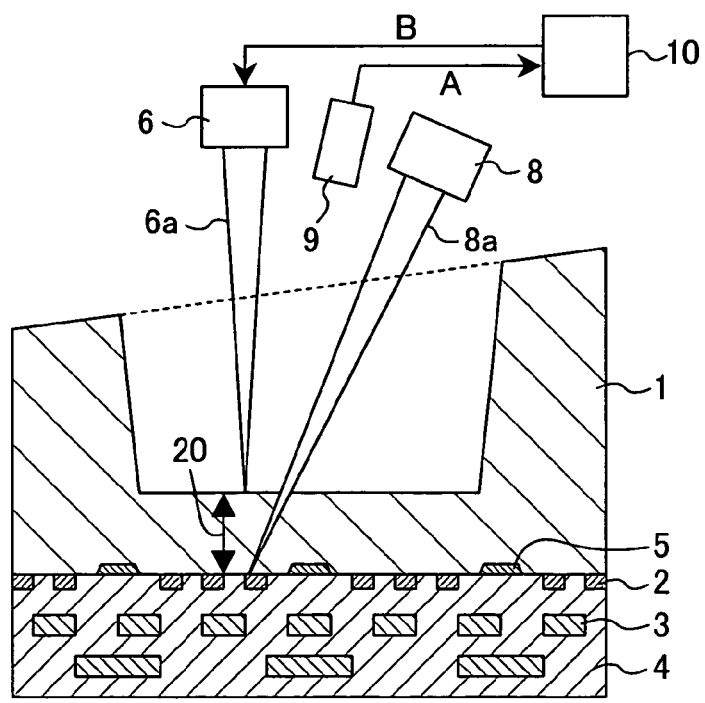
FIG. 4 is a schematic view illustrating semiconductor processing system and method according to a fifth embodiment of the present invention.

FIG. 4 illustrates a cross section of a silicon chip (semiconductor substrate) and a semiconductor processing system for performing a trench processing to the silicon chip from a back surface thereof. In FIG. 4, each member also shown in FIG. 1 in the first embodiment is identified by the same reference numeral. In FIG. 4, the back surface of the silicon chip is not flat. Hereinafter, a method for forming a trench in the uneven surface of the silicon chip will be described.

First, as shown in FIG. 4, on the assumption that as a processing end point, a point is set at a certain distance from the boundary between a silicon substrate 1 and an interlevel insulation film 4 so that a certain silicon film thickness 20 remains, description will be made. When a focused ion beam 6a scans, part of the silicon substrate 1 which the focused ion beam 6a scans is etched, so that a trench processing proceeds. As in the first and second embodiments, a series of operations (process steps) from processing using the focused ion beam 6a to observation using an electron beam 8a is repeated so that the trench processing proceeds until a secondary electron image (first secondary electron image) generated by the electron beam 8a appears. Moreover, by the same processing as that in each of the first and second embodiments, feedback to the focused ion beam irradiator 8 is performed according to variation in a contrast intensity of the secondary electron image in an image processing system 10.

Figure 5:
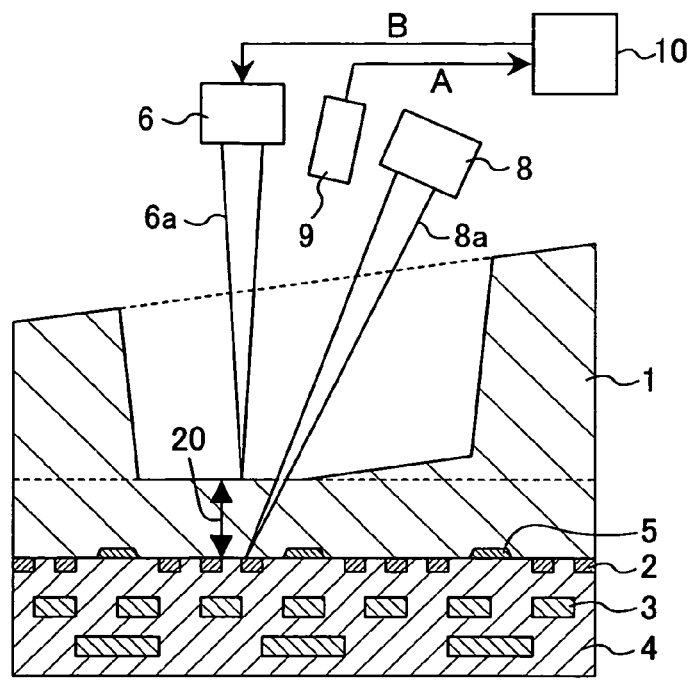
FIG. 5 is another schematic view illustrating semiconductor processing system and method according to the fifth embodiment of the present invention.
Figure 6:
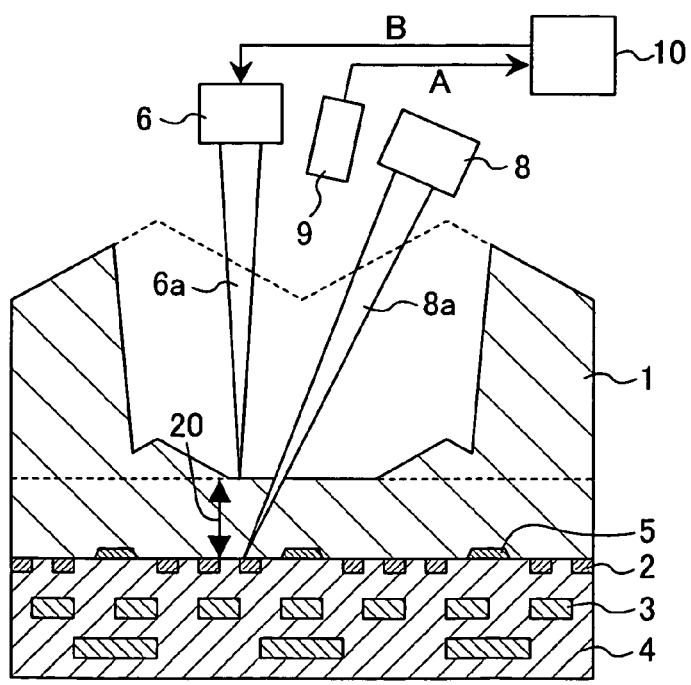
FIG. 6 is still another schematic view illustrating semiconductor processing system and method according to the fifth embodiment of the present invention.

FIG. 5 illustrates a processing state when a trench processing is performed to a silicon chip of which a surface to be processed is inclined and part of the surface has reached a processing end point. In such a case, a mechanism for turning OFF a current of the focused ion beam 6a only when the focused ion beam 6a scans part of the silicon chip in its scanning range in which an intensity of contrast of the second electron image has reached a certain level and thereby stopping the processing for the part is used. Thus, a processing using the focused ion beam 6a can be performed to only part of the silicon chip in which a processing end point is not reached and a large silicon remaining thickness is left in its scanning range. When the intensity of contrast of the secondary electron image reaches a certain level in entire part of the silicon chip located in the scanning range of the focused ion beam 6a, the scanning of the focused ion beam 6a is stopped (the processing is terminated). That is, this method includes the step of performing scanning, in a state where the current of the focused ion beam 6a is turned OFF to stop an output, to the part in which a processing end point has been reached and the step of performing scanning, in a state where the current of the focused ion beam 6a is kept ON, to the other part in which the processing end point is not reached. This method can be also used to the silicon chip of which a surface to be processed is not flat as shown in FIG. 6. As described above, as shown in FIG. 4, a trench processing can be performed whatever the state upper part of the silicon substrate 1 is, so that a silicon remaining thickness is set to be an arbitrary set value.

As a method for controlling the focused ion beam 6a using a contrast of a secondary electron image, the method of turning OFF a current of the focused ion beam 6a on reaching part where an intensity of contrast of a secondary electron image has reached a certain level (predetermined level) has been described above. Besides the above-described method, the focused ion beam 6a can be controlled by the following method. A current of the focused ion beam 6a is reduced (continuously reduced) as the intensity of contrast of a secondary electron image is becoming closer to a certain level and when the intensity of contrast of the secondary electron image has reached a certain level, the current of the focused ion beam 6a is turned OFF so that the processing of the part is stopped. Using this method, a trench processing can be performed more efficiently and a smoother trench surface can be provided.

A semiconductor processing method according to this embodiment is also effective in coping with microbubbles occurring in performing a processing. Microbubbles occur from a flaw or the like, during a trench processing, in part of the semiconductor chip in which an etching speed is locally increased. When viewed from a surface of a semiconductor chip, microbubbles look like bubbles. Once microbubbles occur under processing, the part can not be uniformly etched and, accordingly, in a known manner, a trench processing can not be continued. However, using the method of the third embodiment of the present invention, a trench processing can be performed such that part of a semiconductor chip in which microbubbles have occurred is not processed. Thus, growth of microbubbles can be suppressed and also microbubbles can be eliminated.

Fourth Embodiment

Next, semiconductor processing system and method according to a fourth embodiment of the present invention will be described with reference to FIG. 3.

Figure 3:
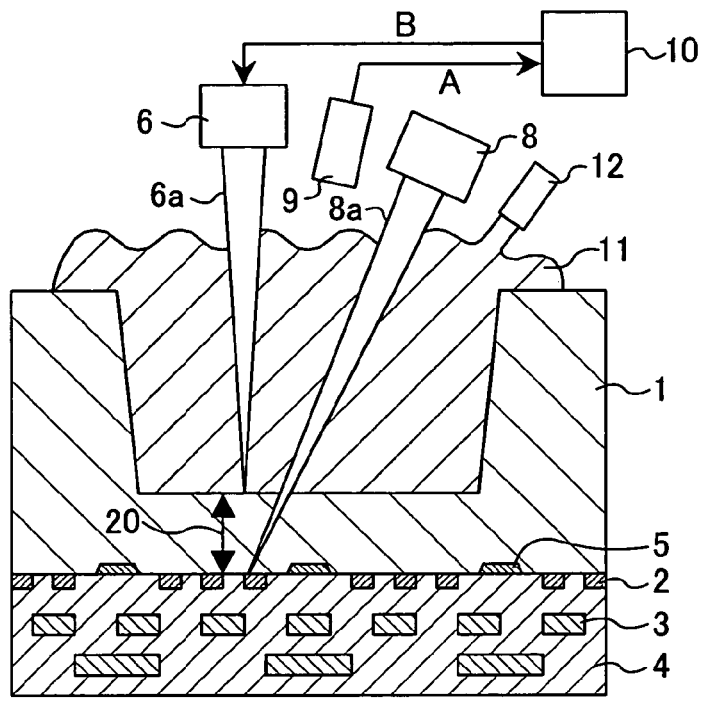
FIG. 3 is a schematic view illustrating semiconductor processing system and method according to a fourth embodiment of the present invention.

FIG. 3 illustrates a cross section of a silicon chip (semiconductor substrate) and a semiconductor processing system for performing a trench processing to the silicon chip from a back surface thereof. The semiconductor processing system of this embodiment shown in FIG. 3 is different from the semiconductor processing system of the first embodiment shown in FIG. 1 in that an assist gas supply section 12 for supplying an assist gas (etching gas) 11 is provided therein.

In such a structure, according to this embodiment, the assist gas 11 is used when the focused ion beam 6a scans. With use of the assist gas 11, there might be cases where a processing speed and a trench shape are improved, compared to the trench processing shown in each of the first through third embodiment. Thus, if the assist gas 11 is used as necessary, a processing can be efficiently performed. As this assist gas, $XeF_2$ gas, $Cl_2$, $Br_2$ or the like is effective.

Fifth Embodiment

Next, a fifth embodiment of the present invention will be described.

In recent years, destruction of a device caused by charge-up during a FIB processing has been a serious problem. Such device destruction occurs because a material carrying positive charges such as $Ga^+$ is used as an ion source for FIB and, when a focused ion beam 6a is irradiated, charges are stored in a semiconductor chip. If this phenomenon exceedingly occurs, a semiconductor chip might be destroyed. In this embodiment, a method for solving this problem will be shown. Specifically, in scanning of the focused ion beam 6a, scanning of an electron beam 8a is performed to almost the same part as the focused ion beam 6a at the same time. This prevents the occurrence of charge-up in the part. In this case, irradiation of an appropriate amount of the electron beam 8a determined in consideration of the amount of a current, a spot size, a pixel space, a duration of beam exposure, an interval and the like for the focused ion beam 6a is effective.

Sixth Embodiment

Next, semiconductor processing system and method according to a sixth embodiment of the present invention will be described with reference to FIG. 7.

Figure 7:
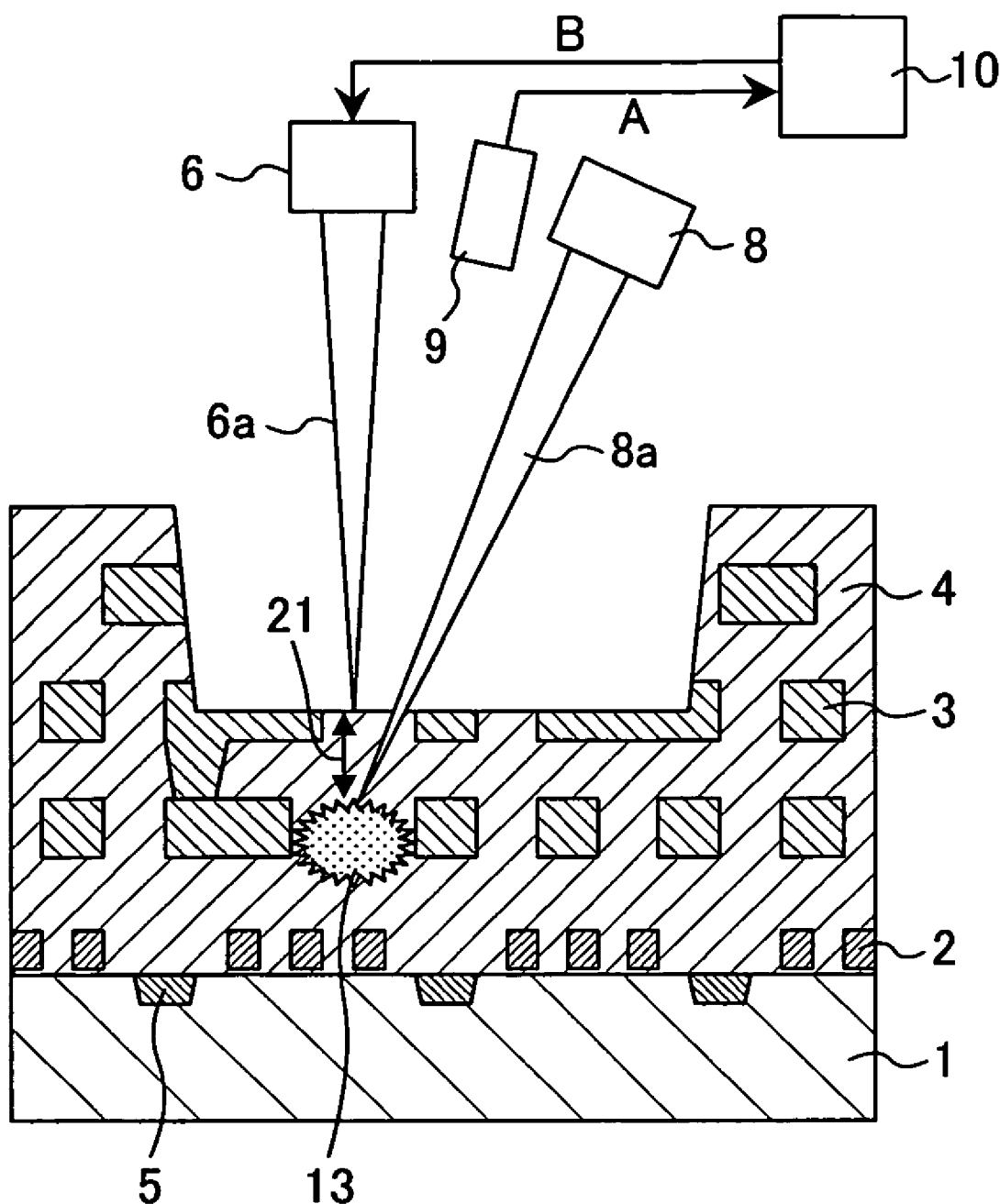
FIG. 7 is a schematic view illustrating semiconductor processing system and method according to a sixth embodiment of the present invention.

The semiconductor processing system of FIG. 7 is the same as the semiconductor processing system of the first embodiment shown in FIG. 1 and therefore the description thereof will be omitted.

In this embodiment, as shown in FIG. 7, a trench processing is performed to a silicon chip (semiconductor substrate) from a surface thereof. The silicon chip includes a silicon substrate 1, a polysilicon layer 2, a metal interconnect layer 3, an interlevel insulation film 4 and a separation layer 5. In FIG. 7, the reference numeral 13 denotes a structure (predetermined target) which is a factor of an anomaly condition in the silicon chip. In this embodiment, a trench processing is performed to analyze the part of the silicon chip having an anomaly condition.

First, as in the first embodiment, an acceleration voltage of an electric beam 8a is set to be a certain value and a series of operations from processing using a focused ion beam 6a to observation using the electron beam 8a is repeatedly performed. When an intensity of contrast of a secondary electron image (first secondary electron image) generated by the electron beam 8a has reached a certain level, a processing using the focused ion beam 6a is stopped and the very small structure 13 which is a cause of an anomaly condition is observed. In this case, an acceleration voltage set for the electron beam 8a is determined in consideration of the size of the very small structure 13, a material for the interlevel insulation film 4 and the like so that a mean free path of electrons is substantially the same as a distance (predetermined distance) from a surface which is appropriate for observation of the very small structure 13. By setting the acceleration voltage in this manner, it becomes possible to stop the processing using the focused ion beam 6a and start observation when the intensity of contrast of the secondary electron image has reached a certain level appropriate for observation, i.e., before the structure 13 is destroyed.

The present invention can be applied to an analyzing system for analyzing anomaly part of a semiconductor chip, which is used in a manufacturing line of an automated semiconductor fabrication facility.

Seventh Embodiment

Next, in a seventh embodiment of the present invention, semiconductor processing system and method which efficiently performs analysis of anomaly part in a short time will be described with reference to FIG. 8.

Figure 8:
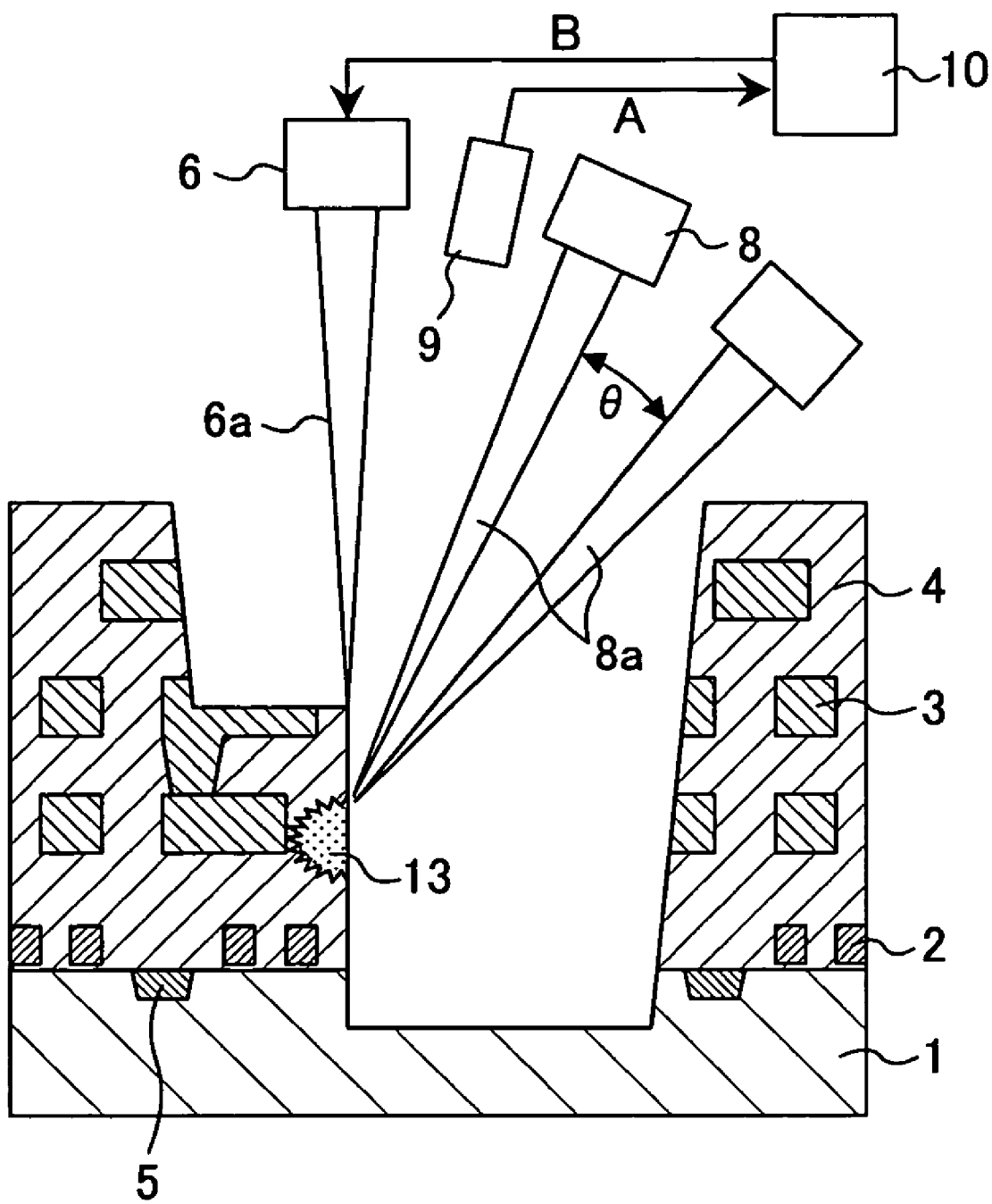
FIG. 8 is a schematic view illustrating semiconductor processing system and method according to a seventh embodiment of the present invention.
Figure 9:
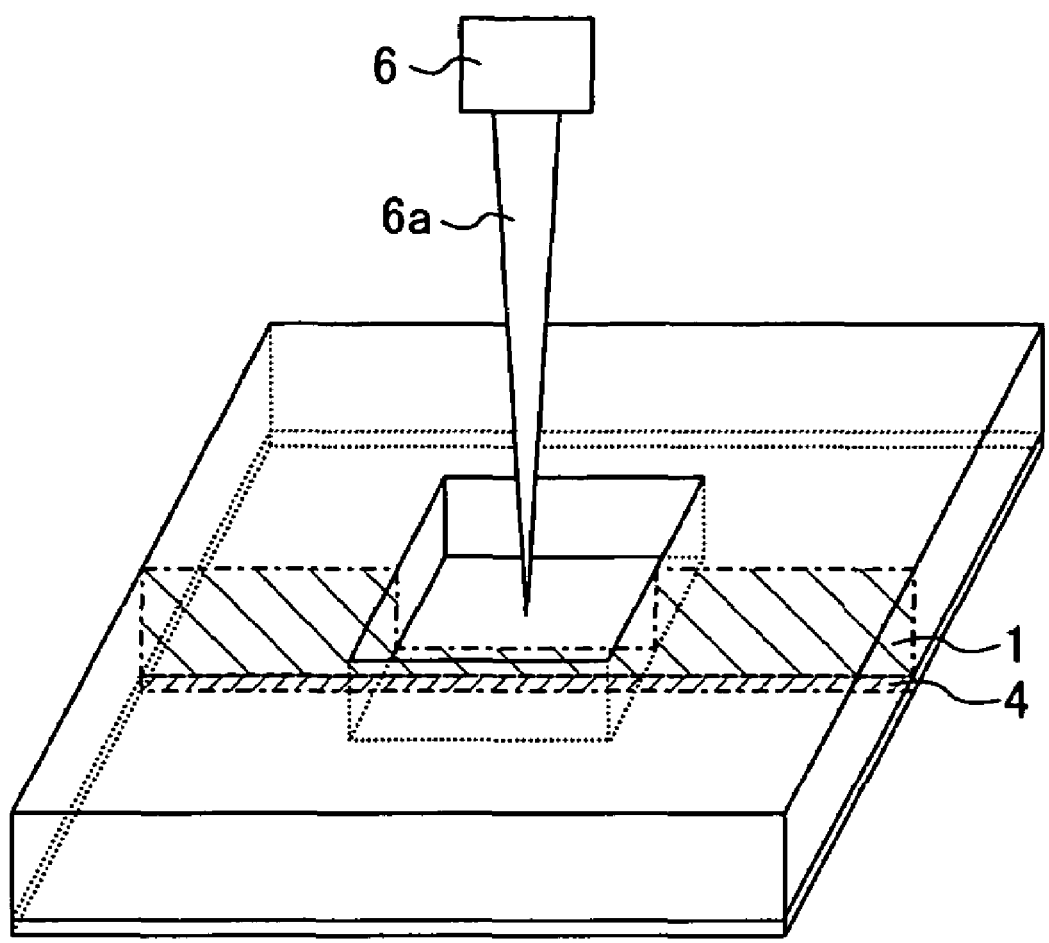
FIG. 9 is a schematic view illustrating FIB processing according to a known technique.
Figure 10:
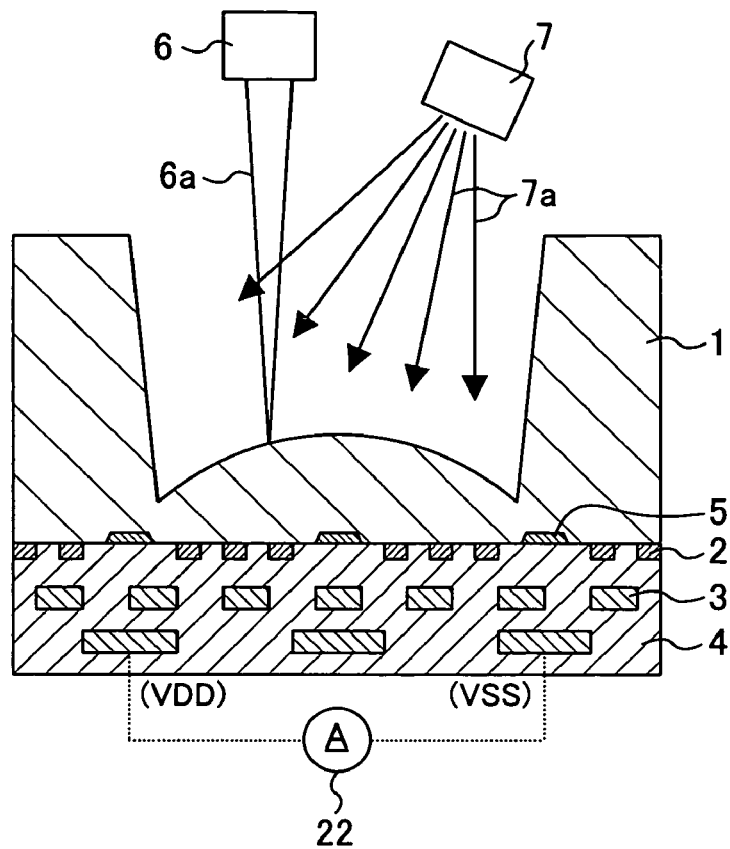
FIG. 10 is a schematic view illustrating processing of a semiconductor chip according to a known technique.
Figure 11:
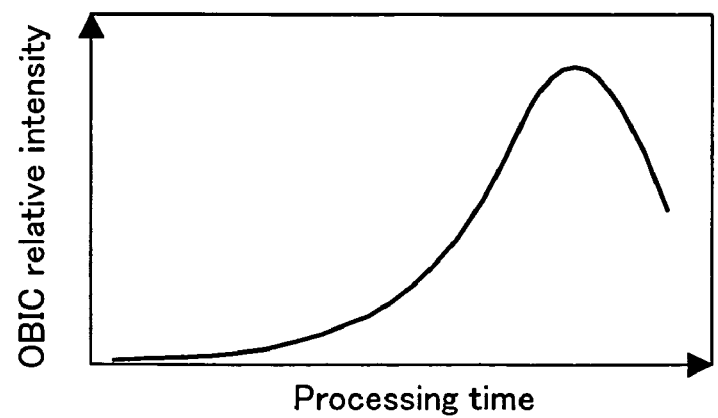
FIG. 11 is a graph showing the relationship between OBIC relative intensity and processing time in processing a semiconductor chip according to a known technique.

The semiconductor processing system of FIG. 8 is different from the semiconductor processing system of FIG. 1 in that in an electron beam irradiator 8, an irradiation angle with respect to a target (predetermined target) to which an electron beam 8a is irradiated can be changed.

With the semiconductor processing system in the above described structure, for example, a processing using a focused ion beam 6a is stopped before a structure 13 by the method of the sixth embodiment shown in FIG. 7, as shown in FIG. 8, a scanning range of the focused ion beam 6a is changed as necessary, and then a cross section processing for having a cross section of the structure 13 exposed is performed. Thereafter, an angle at which an electron beam irradiator generator 8 is installed is changed and a cross-sectional structure of the structure 13 is observed.

As an irradiation angle of the electron beam 8a is closer to 0 degree with respect to a surface, more information for the surface can be collected. Therefore, even when an area of an opening made by a FIB processing is small, a processing can be performed. As the angle at which the electron beam irradiator 6 is installed is closer to 90 degrees, observation of a cross section can be more advantageously performed. However, the range in which the installation angle θ can be moved is limited according to an area of an opening made by a FIB processing when the cross section processing is performed.

In this embodiment, the structure in which the angle in which a single electron beam generator 6 is installed is adjusted has been described. However, with a structure including two or more electron beam generators (a plurality of electron beam irradiation sections) installed in a different angle, the same effects can be achieved.

In each of the first through seventh embodiments, the description has been made using a silicon semiconductor chip as an example. However, it is needless to say that a processing can be performed to a semiconductor chip of some other material such as GaAs or the like in the same manner.

Semiconductor processing method and system according to the present invention relates to a technique in which a processing is performed while a processing state of a material processed using a focused ion beam is observed using an electron beam. By using this technique, a trench processing can be performed with high accuracy until a target processing end point is reached. Therefore, the inventive method and system are useful particularly in performing processing and observation to a semiconductor with a reduced size and an increased number of layers. Moreover, the present invention can be used in a system, such as a mask repair apparatus, for performing etching using an ion beam. Also, the present invention can be applied to some other field in which a remaining film has to be controlled with high accuracy.

What is claimed is:

1. A semiconductor processing method for processing a surface of a semiconductor substrate by scanning of a focused ion beam, the method comprising:

a focused ion beam irradiation step of irradiating the focused ion beam to process the surface of the semiconductor substrate;

an electron beam irradiation step of irradiating an electron beam having a predetermined transmission property to part of the surface of the semiconductor substrate which is processed by the focused ion beam;

an observation step of detecting a first secondary electron image generated by irradiation of the electron beam and a secondary ion image and a second secondary electron image which are generated by irradiation of the focused ion beam and observing the images; and a processing control step of determining, based on a contrast intensity of the first secondary electron image, the secondary ion image or the second secondary electron image which has been detected in the observation step and which shows an image of a predetermined target located inside the semiconductor substrate, a distance from the part of the semiconductor substrate surface which is processed by the focused ion beam to the predetermined target and controlling a processing progress by controlling an output of the focused ion beam according to a result of the determination, wherein in the processing control step, scanning of the focused ion beam is performed with an output of the focused ion beam stopped in part of the semiconductor substrate in which the contrast intensity has reached a predetermined level, thereby controlling the processing progress.

2. A semiconductor processing method for processing a surface of a semiconductor substrate by scanning of a focused ion beam, the method comprising:
- a focused ion beam irradiation step of irradiating the focused ion beam to process the surface of the semiconductor substrate;
- an electron beam irradiation step of irradiating an electron beam having a predetermined transmission property to part of the surface of the semiconductor substrate which is processed by the focused ion beam;
- an observation step of detecting a first secondary electron image generated by irradiation of the electron beam and a secondary ion image and a second secondary electron image which are generated by irradiation of the focused ion beam and observing the images; and
- a processing control step of determining, based on a contrast intensity of the first secondary electron image, the secondary ion image or the second secondary electron image which has been detected in the observation step and which shows an image of a predetermined target located inside the semiconductor substrate, a distance from the part of the semiconductor substrate surface which is processed by the focused ion beam to the predetermined target and controlling a processing progress by controlling an output of the focused ion beam according to a result of the determination,
- wherein in the processing control step, scanning of the focused ion beam is performed with an output of the focused ion beam reduced in part of the semiconductor substrate in which the contrast intensity has reached a predetermined level, thereby controlling the processing progress.

3. A semiconductor processing method for processing a surface of a semiconductor substrate by scanning of a focused ion beam, the method comprising:
- a focused ion beam irradiation step of irradiating the focused ion beam to process the surface of the semiconductor substrate;
- an electron beam irradiation step of irradiating an electron beam having a predetermined transmission property to part of the surface of the semiconductor substrate which is processed by the focused ion beam;
- an observation step of detecting a first secondary electron image generated by irradiation of the electron beam and a secondary ion image and a second secondary electron image which are generated by irradiation of the focused ion beam and observing the images; and
- a processing control step of determining, based on a contrast intensity of the first secondary electron image, the secondary ion image or the second secondary electron image which has been detected in the observation step and which shows an image of a predetermined target located inside the semiconductor substrate, a distance from the part of the semiconductor substrate surface which is processed by the focused ion beam to the predetermined target and controlling a processing progress by controlling an output of the focused ion beam according to a result of the determination,
- wherein while scanning of the focused ion beam, an assist gas is supplied at least to part of the semiconductor substrate to which the focused ion beam is irradiated.

4. A semiconductor processing system for irradiating a focused ion beam to perform processing to a surface of a semiconductor substrate, the system comprising:
- a focused ion beam irradiator for irradiating the focused ion beam to the surface of the semiconductor substrate;
- an electron beam irradiator for irradiating an electron beam having a predetermined transmission property to part of the surface of the semiconductor substrate which is processed by the focused ion beam;
- an observation section for detecting a first secondary electron image generated by irradiation of the electron beam and a secondary ion image and a second secondary electron image which are generated by irradiation of the focused ion beam and observing the images; and
- a processing control section for determining, based on a contrast intensity of the first secondary electron image, the secondary ion image or the second secondary electron image which has been detected in the observation step and which shows an image of a predetermined target located inside the semiconductor substrate, a distance from the part of the semiconductor substrate surface which is processed by the focused ion beam to the predetermined target and transmitting a control signal for controlling a processing progress by the focused ion beam according to a result of the determination,
- wherein the processing control section transmits a control signal for stopping an output of the focused ion beam when the contrast intensity obtained by the observation section has reached a predetermined level.

5. A semiconductor processing system for irradiating a focused ion beam to perform processing to a surface of a semiconductor substrate, the system comprising:
- a focused ion beam irradiator for irradiating the focused ion beam to the surface of the semiconductor substrate;
- an electron beam irradiator for irradiating an electron beam having a predetermined transmission property to part of the surface of the semiconductor substrate which is processed by the focused ion beam;
- an observation section for detecting a first secondary electron image generated by irradiation of the electron beam and a secondary ion image and a second secondary electron image which are generated by irradiation of the focused ion beam and observing the images; and
- a processing control section for determining, based on a contrast intensity of the first secondary electron image, the secondary ion image or the second secondary electron image which has been detected in the observation step and which shows an image of a predetermined target located inside the semiconductor substrate, a distance from the part of the semiconductor substrate surface which is processed by the focused ion beam to the predetermined target and transmitting a control signal for controlling a processing progress by the focused ion beam according to a result of the determination,
- wherein the processing control section transmits a control signal for reducing an output of the focused ion beam when the contrast intensity obtained by the observation section has reached a predetermined level.

6. A semiconductor processing system for irradiating a focused ion beam to perform processing to a surface of a semiconductor substrate, the system comprising:
- a focused ion beam irradiator for irradiating the focused ion beam to the surface of the semiconductor substrate;
- an electron beam irradiator for irradiating an electron beam having a predetermined transmission property to part of the surface of the semiconductor substrate which is processed by the focused ion beam;
- an observation section for detecting a first secondary electron image generated by irradiation of the electron beam and a secondary ion image and a second secondary electron image which are generated by irradiation of the focused ion beam and observing the images; and a processing control section for determining, based on a contrast intensity of the first secondary electron image, the secondary ion image or the second secondary electron image which has been detected in the observation step and which shows an image of a predetermined target located inside the semiconductor substrate, a distance from the part of the semiconductor substrate surface which is processed by the focused ion beam to the predetermined target and transmitting a control signal for controlling a processing progress by the focused ion beam according to a result of the determination, and an assist gas supply section for supplying an assist gas at least to part of the surface of the semiconductor substrate to which the focused ion beam is irradiated while scanning of the focused ion beam by the focused ion beam irradiator.

* * * * *